(12) United States Patent
Maruyama et al.

(10) Patent No.: US 7,981,769 B2
(45) Date of Patent: Jul. 19, 2011

(54) SOLID-STATE IMAGING DEVICE AND METHOD FOR MANUFACTURING THE SAME

(75) Inventors: Yasushi Maruyama, Kanagawa (JP); Hideshi Abe, Kanagawa (JP); Hiroyuki Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/548,907

(22) Filed: Aug. 27, 2009

(65) Prior Publication Data

US 2009/0317932 A1 Dec. 24, 2009

Related U.S. Application Data

(60) Division of application No. 11/466,523, filed on Aug. 23, 2006, now Pat. No. 7,659,183, which is a continuation of application No. 10/978,754, filed on Nov. 1, 2004, now Pat. No. 7,646,047.

(30) Foreign Application Priority Data

Nov. 4, 2003 (JP) ................................. 2003-374627

(51) Int. Cl.
*H01L 21/30* (2006.01)
(52) U.S. Cl. .......................................... 438/459; 438/57
(58) Field of Classification Search .................... 438/57, 438/459
See application file for complete search history.

(56) References Cited

U.S. PATENT DOCUMENTS

| | | | |
|---|---|---|---|
| 6,613,974 B2 | 9/2003 | Husher | |
| 6,930,327 B2 * | 8/2005 | Maeda et al. | 257/59 |
| 2003/0025160 A1 * | 2/2003 | Suzuki et al. | 257/347 |

FOREIGN PATENT DOCUMENTS

| | | |
|---|---|---|
| JP | 06-077461 | 3/1994 |
| JP | 06-283702 | 10/1994 |
| JP | 2003-031785 | 1/2003 |
| JP | 2003-078826 | 3/2003 |
| JP | 2003-273343 | 9/2003 |

OTHER PUBLICATIONS

Japanese Office Action dated Jul. 10, 2007.

* cited by examiner

*Primary Examiner* — Douglas M Menz
(74) *Attorney, Agent, or Firm* — SNR Denton US LLP

(57) ABSTRACT

A solid-state imaging device having a high sensitivity and a structure in which a miniaturized pixel is obtained, and a method for manufacturing the solid-state imaging device in which an interface is stable, a spectroscopic characteristic is excellent and which can be manufactured with a high yield ratio are provided. The solid-state imaging device includes at least a silicon layer formed with a photo sensor portion and a wiring layer formed on the front-surface side of the silicon layer, and in which light L is made to enter from the rear-surface side opposite to the front-surface side of the silicon layer and the thickness of the silicon layer 4 is 10 μm or less. Also, the method for manufacturing the solid-state imaging device at least includes the steps of: forming a semiconductor region of a photo sensor portion in a silicon layer of a layered substrate in which a silicon substrate, an intermediate layer and a silicon layer are laminated; bonding a first supporting substrate onto the silicon layer; removing the silicon substrate and the intermediate layer; forming thereafter a wiring portion above the silicon layer; bonding a second supporting substrate onto the wiring portion, and removing the first supporting substrate to make the silicon layer exposed.

16 Claims, 11 Drawing Sheets

SOLID-STATE IMAGING DEVICE AND METHOD FOR MANUFACTURING THE SAME

RELATED APPLICATION DATA

This application is a divisional of U.S. patent application Ser. No. 11/466,523, filed Aug. 23, 2006, which is a continuation of U.S. patent application Ser. No. 10/978,754, filed Nov. 1, 2004, the entirety both of which are incorporated herein by reference to the extent permitted by law. The present invention claims priority to Japanese patent application No. 2003-374627 filed in the Japanese Patent Office on Nov. 4, 2003, the entirety of which also is incorporated by reference herein to the extent permitted by law.

BACKGROUND OF THE INVENTION

The present invention relates to a solid-state imaging device and a method for manufacturing the same, and particularly relates to what is called a solid-state imaging device of a back-illuminated type and a method for manufacturing the same.

DESCRIPTION OF THE RELATED ART

With a high density integration of a semiconductor device, a transistor and other semiconductor elements have been tried to be more miniaturized and to raise mounting density more than before.

Therefore, in a CMOS image sensor (CMOS type solid-state imaging device), it is required that a pixel is made minute and an element is made to be highly integrated.

However, in a conventional CMOS image sensor in which light detection is performed by irradiating a photo sensor portion with light from a lens formed on a wiring portion through the space between wiring layers, the photo sensor portion can not be irradiated with an enough amount of light, because an eclipse of incident light due to the obstacle such as a wiring layer occurs and an aperture ratio of the photo sensor portion is made small in accordance with the high density integration of device to make the pixel become minute. Accordingly, such problems as lower sensitivity and more shading may occur.

Therefore, the photo sensor portion is irradiated with light from the rear side (opposite side to the wiring portion), so that an effective 100% ratio of aperture can be achieved and sensitivity can be sufficiently raised without an influence of an obstacle such as a wiring layer.

Accordingly, a CMOS image sensor in which the photo sensor portion is irradiated with light from the rear-surface side (opposite side to the wiring portion), what is called a back-illuminated type CMOS image sensor, has been developed.

Then, in the back-illuminated type CMOS image sensor, it is considered that a silicon layer of the photo sensor portion is made thin to obtain higher sensitivity (refer to, for example, patent document 1 or patent document 2).

FIG. 1 is a vertically sectional view schematically showing a back-illuminated type CMOS image sensor to which the above described construction is applied.

In a MOS sensor 100, since a silicon substrate 101 including photo sensor portions 102 is made thin, sensitivity to incident light L can be raised.

Further, since the incident light L is not blocked even if wiring layers 104 are formed on the photo sensor portions 102, flexibility in layout of the wiring layers 104 can be obtained. Accordingly, the high density integration of an element can be obtained by forming the wiring layer 104 to be multi-layered and by minimizing an area of a pixel.

A method for manufacturing the back-illuminated type image sensor having such a thin silicon layer is considered, in which, for example, after a photo diode of a photo sensor portion is formed in a silicon substrate, the silicon substrate is ground from the back thereof to be thin.

Patent document 1: Japanese Published Patent Application No. H6-77461 (FIG. 3)

Patent document 2: Japanese Published Patent Application No. H6-283702 (FIG. 2)

However, in the above-described manufacturing method, an interface of the silicon substrate after grinding the back surface becomes electrically unstable. Also, a mechanical damage may affect the silicon substrate.

As a result, dark current is caused due to the above problems.

Hence, an image sensor of the back-illuminated type having the above-described structure has a limitation in use such as requiring a cooling process.

Furthermore, light absorption depends upon the thickness of a silicon layer; however, since the thickness is made thin by grinding, control for the thickness of the silicon layer (silicon substrate) of the photo sensor portion becomes deteriorated, so that the spectroscopic characteristic as the sensor tends to disperse.

As a result, the manufacturing yield ratio becomes deteriorated, and the cost may increase because of such a problem.

Therefore, the back-illuminated type structure has been used only for limited purposes, though the sensitivity of the photo sensor portion could be improved.

In addition, a conventional image sensor of the back-illuminated type structure has several ten micro-meter of the thickness of a silicon layer in which the photo sensor portion performing the photo-electric conversion is formed; and when a pixel is miniaturized, the electric-charge of a signal diffuses between adjacent pixels to generate mixed color.

Accordingly, it is difficult to realize a minute pixel.

To solve the above-described problems, the present invention provides a solid-state imaging device having a structure in which sensitivity is high, almost no shading occurs and a pixel can be miniaturized.

Further, the present invention provides a method for manufacturing a solid-state imaging device, in which the solid-state imaging device having a stable interface and an excellent spectroscopic characteristic can be manufactured with a high yield ratio.

SUMMARY OF THE INVENTION

A solid-state imaging device according to the present invention includes at least a silicon layer having a photo sensor portion in which photo-electric conversion is performed and a wiring layer formed on the front-surface side of the silicon layer, in which light is made to enter from the rear-surface side that is opposite to the front-surface side of the silicon layer and the thickness of the silicon layer is 10 µm or less.

According to the above-described present invention, a structure of what is called a back-illuminated type is formed with the structure including at least a silicon layer formed with a photo sensor portion and a wiring layer formed on the front-surface side of the silicon layer, in which light is made to enter from the rear-surface side of the silicon layer. Further, since the thickness of the silicon layer is 10 µm or less, high sensitivity is obtained in the wide range of wavelength including infrared range and a drift electric-field of approximately 200 mV/μm or more can be formed with a design having the range of drive voltage (2.5V to 3.3V) that is conventionally used.

Furthermore, since the thickness of the silicon layer is thinner than the conventional ones, the distance between a lens and a semiconductor region of the photo sensor portion can be shortened.

A solid-state imaging device according to the present invention includes at least a silicon layer having a photo sensor portion in which the photo-electric conversion is performed and a wiring layer formed on the front-surface side of the silicon layer, in which light is made to enter from the rear-surface side that is opposite to the front-surface side of the silicon layer and the thickness of the silicon layer is 5 μm or less.

According to the above-described present invention, a structure of what is called a back-illuminated type is formed with the structure including at least a silicon layer formed with a photo sensor portion and a wiring layer formed on the front-surface side of the silicon layer, in which light is made to enter from the rear-surface side of the silicon layer. Further, since the thickness of the silicon layer is 5 μm or less, high sensitivity is obtained in the visible light range and a drift electric-field with an approximate intensity of 400 mV/μm or more can be formed with a design having the range of drive voltage (2.5V to 3.3V) that is conventionally used.

Furthermore, since the thickness of the silicon layer is further thinner than the conventional ones, the distance between a lens and a semiconductor region of the photo sensor portion can further be shortened.

A method for manufacturing a solid-state imaging device according to the present invention is the method in which a layered substrate formed with a silicon substrate, an intermediate layer and a silicon layer laminated is used, including at least the steps of: forming a semiconductor region of a photo sensor portion in the silicon layer of the layered substrate; bonding a first supporting substrate to the silicon layer; removing the silicon substrate and the intermediate layer of the layered substrate; then forming above the silicon layer a wiring portion having a wiring layer in an insulative layer; bonding a second supporting substrate to the wiring portion; and removing the first supporting substrate to make the silicon layer exposed.

According to the above-described method for manufacturing a solid-state imaging device of the present invention, since the wiring portion is formed on the silicon layer and the first supporting substrate is removed to make the silicon layer exposed, the rear-surface side of the silicon layer, which is opposite to the front-surface side in which a wiring portion is formed, is exposed to obtain the back-illuminated type structure in which light enters from the rear-surface side.

Further, since a layered substrate in which a silicon substrate, an intermediate layer and a silicon layer are laminated is used and a semiconductor region of a photo sensor portion is formed in the silicon layer of the layered substrate, an interface of a silicon layer on which the semiconductor region of a photo sensor portion is formed becomes comparatively stable, so that the spectroscopic characteristic of a solid-state imaging device can easily be stabilized by controlling the thickness of a silicon layer.

Moreover, with respect to a silicon layer where a semiconductor region is formed, since a wiring portion is formed on the front-surface side thereof and the first supporting substrate is bonded to the rear-surface side and then the first supporting substrate is removed, there is no need to grind the silicon layer and a mechanical damage can be prevented from affecting the silicon layer.

Further, upon use of a layered substrate including a thin silicon layer, a solid-state imaging device having the above-described solid-state imaging device of the present invention, that is, having a structure of a solid-state imaging device in which the silicon layer including a semiconductor region of a photo sensor portion is thin to be 10 μm or less (or 5 μm or less) can be manufactured.

A method for manufacturing a solid-state imaging device according to the present invention is the method in which a layered substrate formed with a silicon substrate, an intermediate layer and a silicon layer laminated is used, including at least the steps of: forming a semiconductor region of a photo sensor portion in the silicon layer of the layered substrate; forming on the silicon layer a wiring portion having a wiring layer in an insulative layer; then bonding a supporting substrate to the wiring portion; and removing the silicon substrate and the intermediate layer to make the silicon layer exposed.

According to the above-described method for manufacturing a solid-state imaging device of the present invention, since the wiring portion is formed on the silicon layer and the silicon substrate and the intermediate layer of the laminated substrate are removed to make the silicon layer exposed, the rear-surface side of the silicon layer, which is opposite to the front-surface side in which a wiring portion is formed, is exposed to obtain the back-illuminated type structure in which light enters from the rear-surface side.

Further, since a layered substrate in which a silicon substrate, an intermediate layer and a silicon layer are laminated is used and a semiconductor region of a photo sensor portion is formed in the silicon layer of the layered substrate, an interface of a silicon layer on which a semiconductor region of a photo sensor portion is formed becomes comparatively stable, so that the spectroscopic characteristic of a solid-state imaging device can easily be stabilized by controlling the thickness of a silicon layer.

Moreover, with respect to a silicon layer where a semiconductor region is formed, since a wiring portion is formed on the front-surface side thereof and the silicon substrate and the intermediate layer are removed, there is no need to grind the silicon layer and a mechanical damage can be prevented from affecting the silicon layer.

Further, upon use of a layered substrate including a thin silicon layer, a solid-state imaging device having the above-described solid-state imaging device of the present invention, that is, having a structure of a solid-state imaging device in which the silicon layer including a semiconductor region of a photo sensor portion is thin to be 10 μm or less (or 5 μm or less) can be manufactured.

According to a solid-state imaging device of the present invention, since what is called a back-illuminated type structure is formed, sensitivity can be improved and the occurrence of shading in the surrounding pixels can be controlled; and further, since the thickness of the silicon layer is 10 μm or less, a high sensitivity is obtained in the wide range of the wavelength including infrared regions, and a sufficient drift electric-field is formed to make the read-out of the electric-charge to the front-surface side carried out securely.

Further, since the distance between a lens and a semiconductor region of the photo sensor portion can be shortened, the occurrence of mixed color caused by light incident on adjacent pixels can be restrained.

According to a solid-state imaging device of the present invention, since what is called a back-illuminated type structure is formed, sensitivity can be improved and the occurrence of shading in the surrounding pixels can be restrained; and further, since the thickness of the silicon layer is 5 μm or less, a high sensitivity can be obtained in the range of visible light, and the drift electric-field with enough intensity can be formed to make the electric-charge read-out to the front-surface side.

Further, since the distance between a lens and a semiconductor region of the photo sensor portion can be shortened, the occurrence of mixed color caused by light incident on adjacent pixels can be controlled.

Furthermore, an ion implantation when forming a semiconductor region of a photo sensor portion can easily be performed using, for example, only a photo resist as a mask.

Therefore, according to the present invention, a solid-state imaging device of the back-illuminated type structure in which a high sensitivity is obtained and the electric-charge can be read out to the front-surface side can be realized.

Further, the flexibility in the layout of a wiring layer and design can be obtained due to the back-illuminated type structure, and the occurrence of mixed color caused by light incident on adjacent pixels can be restrained due to a thin silicon layer, so that a pixel can easily be miniaturized. With the miniaturization of pixels of the solid-state imaging device, the solid-state imaging device can be highly integrated and be small-sized.

Moreover, in each of the above-described respective solid-state imaging devices of the present invention, when an element isolation region is formed between each pixel of said photo sensor portion in the whole thickness direction, the pixels can be electrically separated by the element isolation region and color electrically mixed with adjacent pixels can be prevented.

Further, in each of the above-described solid-state imaging devices of the present invention, when a region of a second conduction type is formed in the vicinity of an interface of the silicon layer on the rear-surface side, which is opposite to a region of a first conduction type constituting a photo sensor portion, a dark current generated in the vicinity of the interface of the silicon layer on the rear-surface side can be reduced.

According to the method for manufacturing a solid-state imaging device of the present invention, since the first supporting substrate is bonded onto a silicon layer; a wiring portion is formed above the silicon layer after a silicon substrate and an intermediate layer of a layered substrate are removed; the second supporting substrate is bonded onto the wiring portion; and the first supporting substrate is removed to make the silicon layer exposed, the interface of the silicon layer becomes stable and the spectroscopic characteristic of a solid-state imaging device is stabilized by controlling the thickness of the silicon layer, so that a solid-state imaging device with an excellent spectroscopic characteristic can be manufactured with a high yield ratio.

Further, upon use of a layered substrate having a thin silicon layer, a solid-state imaging device having a thin silicon layer in which a semiconductor region of a photo sensor portion is formed can easily be manufactured.

Particularly, when the first supporting substrate is bonded to a silicon layer, the heat treatment at a comparatively high temperature such as at about 1100 degree-centigrade is executed to make an impurity of a semiconductor region of the silicon layer activated and to make the crystallinity on the interface of the silicon layer improved, so that a solid-state imaging device scarcely having noise can be manufactured.

According to the method for manufacturing a solid-state imaging device of the present invention, since a wiring portion is formed above a silicon layer; a supporting substrate is bonded onto the silicon layer; and a silicon substrate and an intermediate layer of a layered substrate are removed to make the silicon layer exposed, the interface of the silicon layer becomes stable and the spectroscopic characteristic of a solid-state imaging device can be stabilized by controlling the thickness of the silicon layer, so that a solid-state imaging device with an excellent spectroscopic characteristic can be manufactured with a high yield ratio.

Further, when a layered substrate having a thin silicon layer is used, a solid-state imaging device having a thin silicon layer in which a semiconductor region of a photo sensor portion is formed can easily be manufactured.

Particularly, since the heat treatment at a comparatively low temperature can be performed for manufacturing, influences of the heat treatment to a transistor and others can be reduced, so that the transistor with a narrow pitch is formed to easily provide a minute pixel. Also, increase in the number of processes can be controlled.

DESCRIPTION OF THE PRESENTLY PREFERRED EMBODIMENTS

Figure 2:
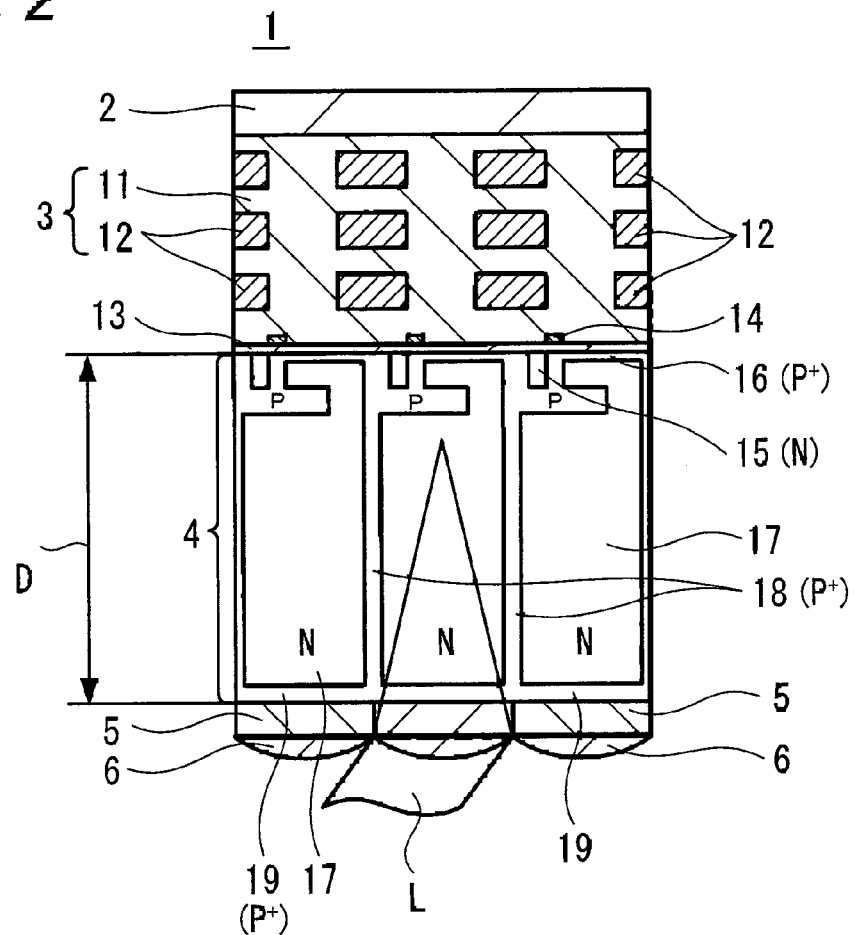
FIG. 2 is a schematic constitutional view (showing a vertical section) of a solid-state imaging device according to an embodiment of the present invention.

FIG. 2 shows a schematic constitutional view (showing a vertical section) of a solid-state imaging device of an embodiment of the present invention. In this embodiment, the present invention is applied to a CMOS image sensor (a CMOS type solid-state imaging device).

A solid-state imaging device 1 includes a supporting substrate 2, a wiring portion 3, a silicon substrate 4, a color filter 5 and an on-chip lens 6, which are formed from the front-surface side in this order.

In the wiring potion 3, a plurality of wiring layers 12 are formed with an insulative layer 11 formed therebetween. A thin insulative coating 13 which functions as a gate insulative film is formed between the wiring portion 3 and the silicon substrate 4, and a gate electrode 14 is formed on the front-surface side of the insulative layer 13 for the read-out of the electric-charge.

An N-type region 17 constituting a photo diode of a photo sensor portion is formed in the silicon substrate thickly in the thickness direction, and a positive electric charge storage region ($P^+$ region) 16 is formed at a position on the front-surface side of the N-type region 17. Also, an N-type floating diffusion (FD) 15 is formed under the gate electrode 14 with the read-out region in between.

Though not shown in the figure, the supporting substrate 2 and the wiring portion 3 are bonded by an adhesive layer or others. A silicon substrate for example can be used as the supporting substrate 2. Other materials can be used for the material of the substrate as long as having a favorable planarity and having a small difference in thermal expansion rate from that of silicon.

Then, light L is made to enter from the side of the lens 6, namely the rear-surface side opposite to the side of the wiring portion 3, to provide a CMOS image sensor of what is called a back-illuminated type.

A read-out transistor is composed of the gate electrode 14, an end of the N-type region 17 and the floating diffusion 15.

Further, other transistors in a pixel and peripheral circuit elements are formed on the front-side of the silicon substrate 4 in other sections not shown.

Particularly, in this embodiment, the thickness D of the silicon layer (silicon substrate) 4 where the photo censor portion is formed is set to 10 µm or less. Preferably, the thickness D of the silicon layer 4 is set to 5 µm or less.

With the above structure, since the thickness D of the silicon layer 4 is thinly formed, the occurrence of mixed color caused by light incident on the adjacent pixels can be reduced and also a high sensitivity can be obtained.

Further, since a drift electric-field of approximately 200 mV/µm or more can be formed when designed in the range of the drive voltage (2,5V to 3.3V) conventionally used in a CMOS image sensor, the read-out of the electric-charge to the front-surface side is securely performed with this electric-field.

In addition, noise caused by the irradiation of light is equal to or less than that of a CMOS type solid-state imaging device of a front-illuminated type structure.

A high sensitivity can be obtained in the wide range of wavelength including infrared-ray region, when the thickness D of the silicon layer 4 is set to 10 µm or less.

A high sensitivity can be obtained in the range of visible light, when the thickness D of the silicon layer 4 was set to 5 µm or less.

Further, when designed having the range of the above-described drive voltage, a drift electric-field of approximately 400 mV/µm or more can be formed, so that the read-out of the electric-charge to the front-surface side is carried out easily.

When the thickness D of the silicon layer 4 is set to 5 µm or less, an advantage result that the manufacturing becomes easy can be obtained.

When the thickness D of the silicon layer 4 exceeds 5 µm, it is necessary to execute an ion implantation with a super high energy and to form a hard musk of the oxide coating for forming the N-type region 17 in the structure shown in FIG. 2.

On the contrary, when the thickness D of the silicon layer 4 was set to 5 µm or less, manufacturing can be carried out easily, because the ion implantation for forming the N-type region 17 can be performed using a resist mask.

Further, in the solid-state imaging device 1 according to the embodiment of the present invention, a $P^+$ region (a highly concentrated p-type region) 18 is formed as an element isolation region at the position between the N-type regions 17 of the photo sensor portion of the adjacent pixels in the whole depth direction.

Therefore, the N-type region 17 of each pixel can be electrically separated and an electrically mixed color between the adjacent pixels can be prevented.

Furthermore, in the solid-state imaging device 1 according to the embodiment of the present invention, the $P^+$ region 19 is also formed on the rear-surface side of the N-type region 17, in other words, on the side of the color filer 5.

Accordingly, a dark current caused by the interfacial level on the rear-surface side of the silicon layer 4 can be reduced.

Figure 3:
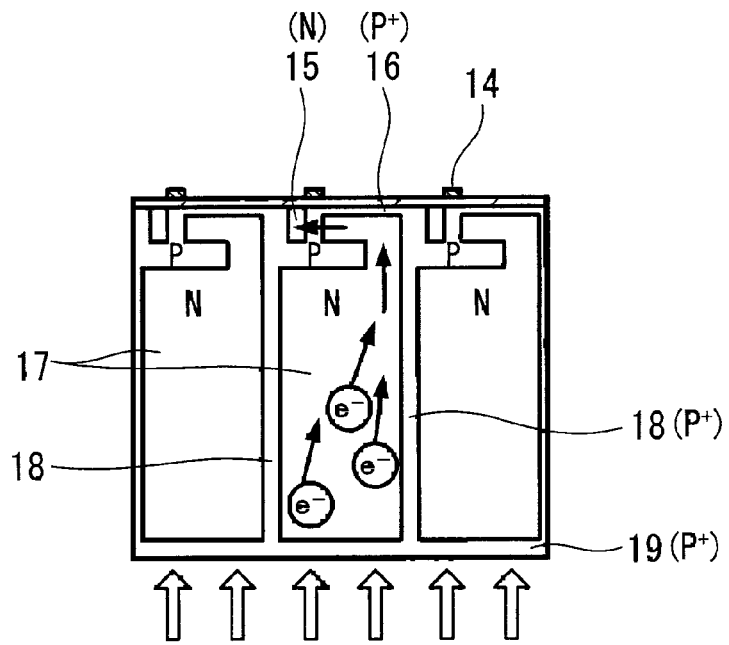
FIG. 3 is a vertically sectional view of a relevant portion of the solid-state imaging device of FIG. 2.

In the solid-state imaging device 1, as shown in a vertical section around the photo sensor portion of FIG. 3, the incident light is converted into the electric-charge at a position comparatively deep in the N-type region of the photo sensor portion (at the portion on the rear-surface side), and the electric-charge $e^-$ moves to the front-surface side as shown by an arrow in FIG. 3. This movement is performed smoother as much as the above-described drift electric-field has a large area.

Then, when the gate electrode 14 becomes the ON state, the electric-charge $e^-$ is read out to the floating diffusions 15.

Here, in the solid-state imaging device 1 of the structure shown in FIG. 2, the relationship between the thickness D of the silicon layer and the dependence of the quantum efficiency on the wavelength of the incident light L in the photo sensor portion is measured.

Figure 4:
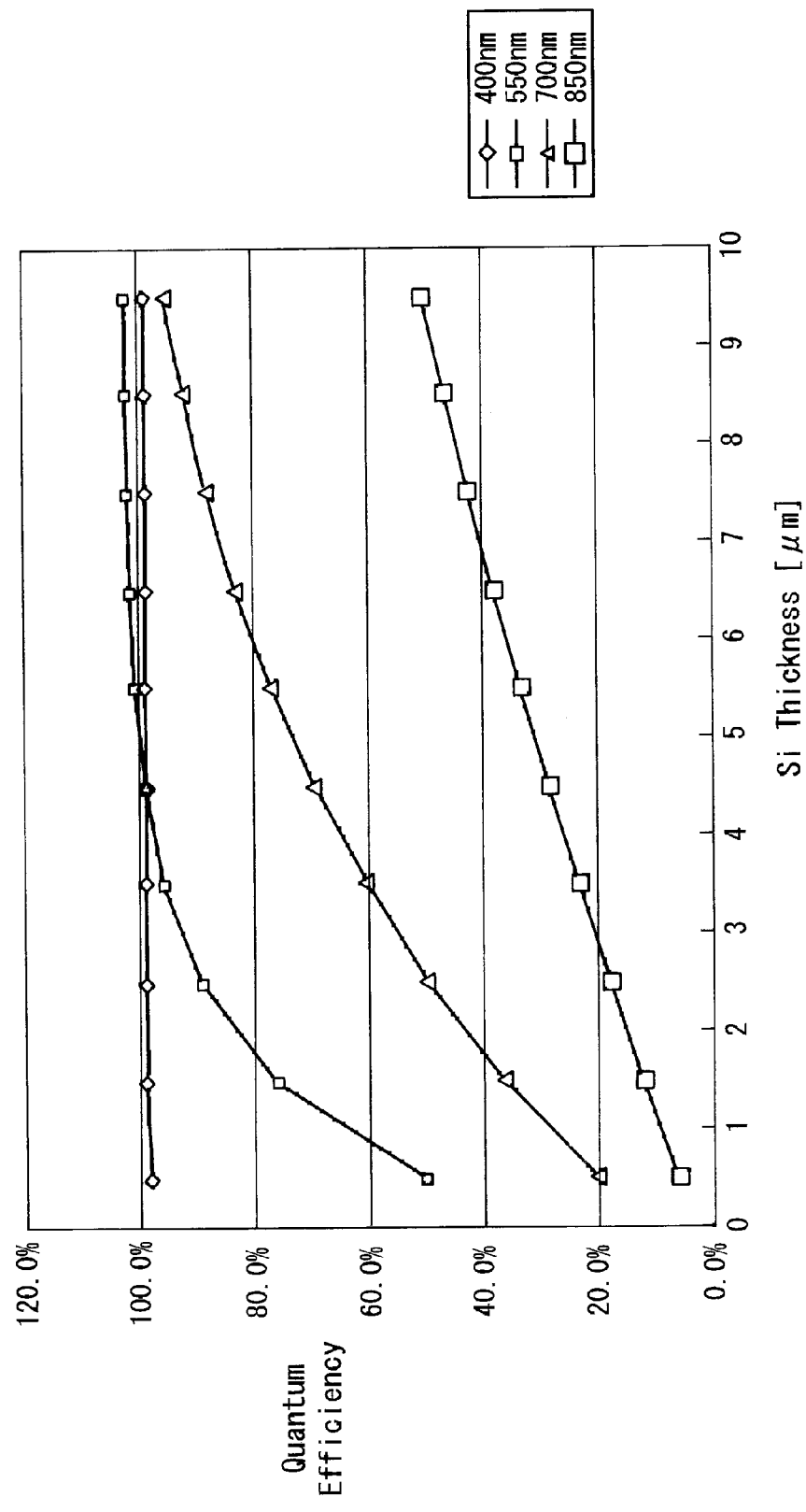
FIG. 4 is a characteristic curve showing the relationship between the thickness of a silicon layer and the dependence of the quantum efficiency on the wavelength of incident light in a photo sensor portion.
Figure 5:
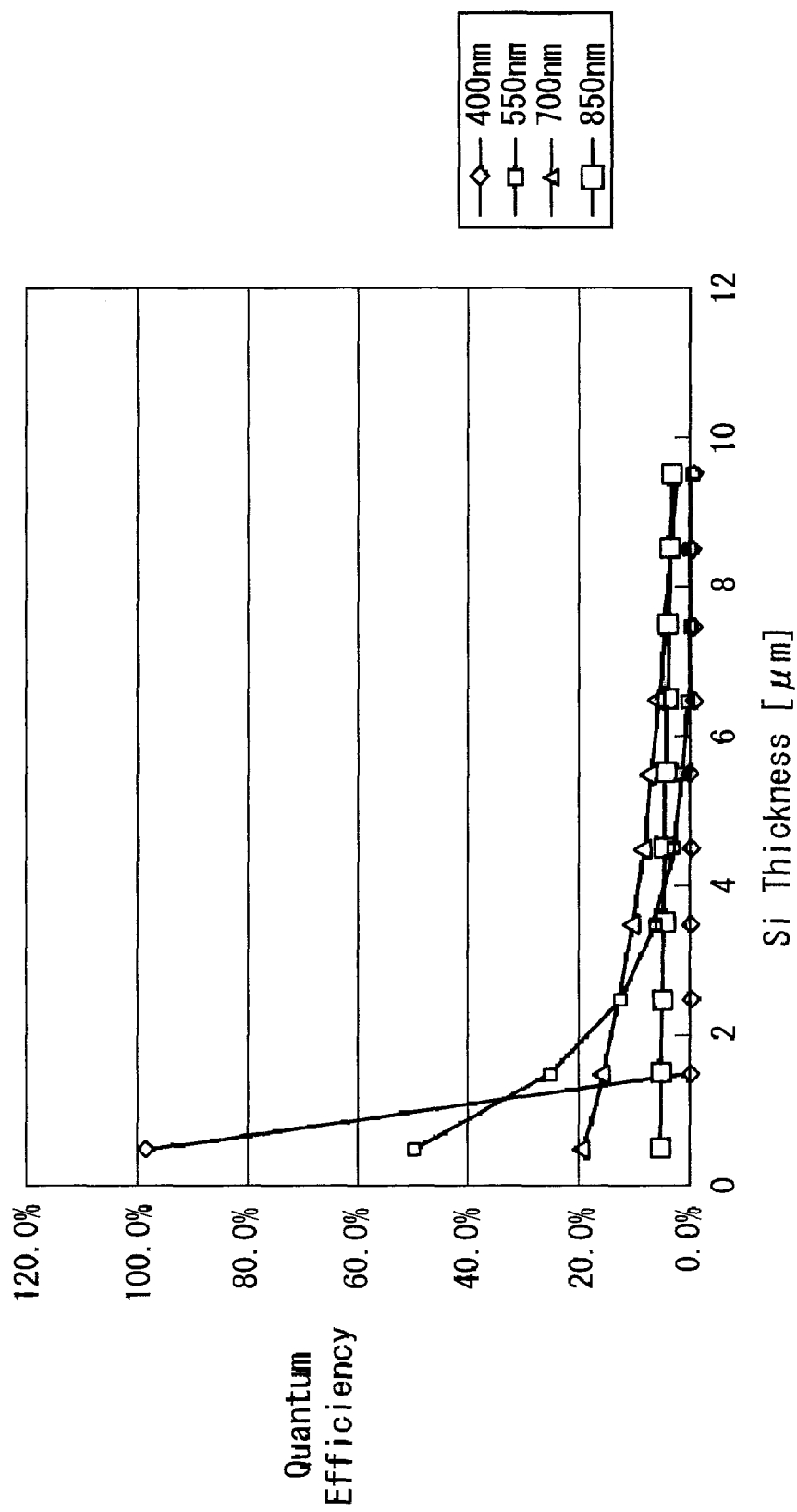
FIG. 5 is a characteristic curve showing the relationship between the thickness of a silicon layer and the dependence of the quantum efficiency on the wavelength of incident light in the photo sensor portion.

The relationship between the thickness D (µm) of the silicon layer and the dependence of the quantum efficiency on the wavelength (nm) of the incident light L in the photo sensor portion is shown in FIGS. 4 and 5. FIG. 4 shows the thickness D of the silicon layer and the quantum efficiency of the whole silicon layer of that thickness. FIG. 5 shows the quantum efficiency (an absorption ratio in each portion) in the thickness range of every 1 µm measured from the side of incident light, and for example the thickness between 2 µm and 3 µm is plotted at 2.5 µm.

According to FIG. 4, blue (the wavelength of around 400 nm) is absorbed by 100% at 2 µm or less and green (the wavelength of around 550 nm) is absorbed by 100% at approximately 5 µm, respectively. Red (the wavelength of around 750 nm) is not absorbed by 100% even at 10 µm.

According to FIG. 5, the absorption ratio of red (750 nm in wavelength) is 2% at the maximum in the depth of 4.75 µm to 5.25 µm (the diffusion layer of a transistor is assumed). Green and blue are negligibly small.

Also, in the solid-state imaging device for the picture application which is seen with human eyes, an infrared ray cut-off filter is provided to prevent the infrared ray from entering.

Figure 6:
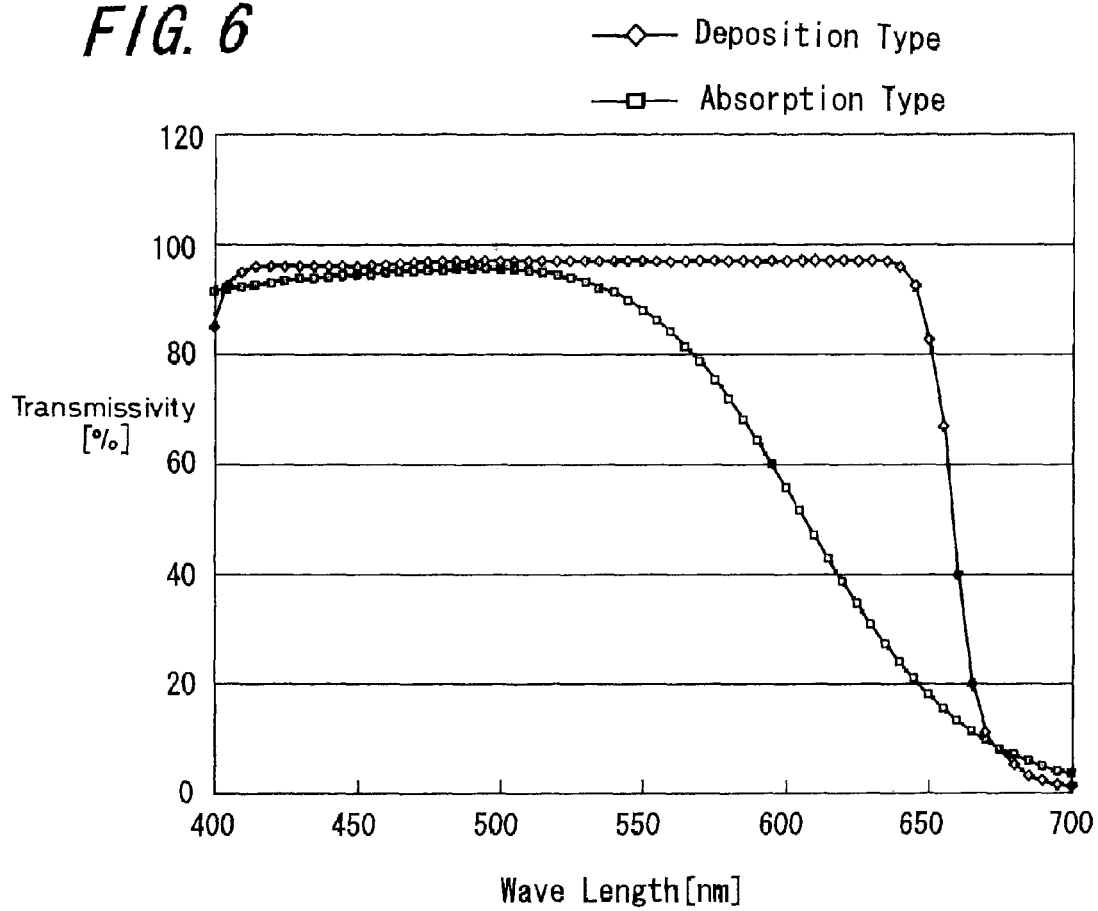
FIG. 6 is a view showing the spectroscopic characteristic of an infrared ray cut-off filter.

FIG. 6 shows the spectroscopic characteristic of the infrared ray cut-off filter. In FIG. 6, both the infrared ray cut-off filter of the deposition type and the infrared ray cut-off filter of the absorption type are shown. The deposition type is conventionally used, and light of the longer wavelength than 650 nm has a cut-off characteristic, though light of the wavelength 650 nm or less is almost transmitted, as shown in FIG. 6.

Therefore, in the solid-state imaging device for the picture application seen with human eyes, the sensitivity on the side of the wavelength longer than 650 nm is not required. Note that, in the case where the above solid-state imaging device is used for monitoring, it is desirable to have the sensitivity to infrared range.

Even if the thickness D of the silicone layer 4 is 5 µm or less, the sensitivity to light of the wavelength 650 nm or less can be obtained satisfactorily, so that the sufficiently high sensitivity is obtained in the solid-state imaging device for the picture application seen by human eyes, when the structure of this embodiment of the present invention is employed.

Further, the occurrence of mixed color by the diffractive light in the CMOS image sensor of the front-illuminated type structure was measured by analyzing the two-dimensional wave, and was found that several percentages thereof existed.

On the other hand, almost no mixed color by the diffractive light has occurred in the CMOS image sensor of the back-illuminated type structure, and the occurrence thereof was less than the limit detected by analyzing the wave (0.1% or less).

However, in the CMOS image sensor of the back-illuminated type structure, light entered from the rear-surface side may affect an element (for example, transistor) on the front surface, and may cause noise.

Hence, with the silicon layer of, for example, 5 µm in thickness, an influence upon an element (a transistor for, example) on the front-surface side caused by the incident light from the rear surface can be restrained, and a total amount of noise can be reduced less than that of CMOS image sensor of the front-illuminated type structure.

According to the structure of the solid-state imaging device 1 of the above-described embodiment of the present invention, the on-chip lens 6 and others are disposed on the side (rear-surface side) opposite to the side (front-surface side) of the wiring portion 3 of the silicon layer 4 where the photo sensor portion is formed, and the back-illuminated type structure in which the light L is made to enter from the rear-surface side is employed, so that there is no wiring layer 12 between the on-chip lens 6 and the photo sensor portion, thus the loss of the incident light by the wiring layer 12 does not occur. Accordingly, the amount of incident light can be increased without changing the area of the photo sensor portion; and also, it becomes possible to increase the area of the photo sensor portion and to set the shape of a pattern of the N-type region 17 to make light easily enter, so that the sensitivity can be improved. Further, the occurrence of shading in the adjacent pixels can be restrained.

Due to the back-illuminated type structure, in this solid-state imaging device shown in FIG. 2, there is no need to pass light through the wiring portion, so that the degree of flexibility in design and the layout of the wiring layer 12 may increase and thus, for example, the coating thickness of the wiring layer 13 and the resistance can be optimized.

Accordingly, the solid-state imaging device 1 of each pixel is miniaturized to attain the high density integration and the miniaturization. With the front-illuminated type structure, it is difficult to make a CMOS image sensor including one million pixels or more; however, with the structure of this embodiment, a CMOS image sensor including one million pixels or more can easily be obtained.

Further, according to the structure of the solid-state imaging device 1 of this embodiment, since the thickness D of the silicon layer 4 is 10 µm or less, or preferably, 5 µm or less, the thickness D of the silicon layer 4 becomes even thinner compared with the conventional back-illuminated type structure which has the silicon layer of approximately several ten µm in thickness, and thus, the distance between the lens 6 and the N-type region 17 of the photo sensor portion can be shortened more, so that the sensitivity can be improved as a result, and also the occurrence of mixed color caused by incident light on the adjacent pixels can be restrained, even if miniaturization of a pixel is performed.

Then, with the thickness of silicon layer 4 reduced, the drift electric-field can be formed with further intensity when the solid-state imaging device is designed in the range of a conventional voltage (from 2,5V to 3.3V), and the electric-charge to which the photo-electric conversion was performed at the rear-surface side can easily be read out to the front-surface side.

Accordingly, even if the amount of the electric-charge accumulated in the photo sensor portion increases, the read-out of the electric-charge can be performed satisfactorily, so that the accumulated electric-charge increases and the dynamic range is improved.

Furthermore, according to the structure of the solid-state imaging device 1 of this embodiment, the $P^+$ region 18 is formed as the element isolation region in the whole thickness direction of the silicon layer 4 at the position between the N-type regions 17 constituting the photo diode of the photo sensor portion of each pixel, so that the pixels can be separated electrically and electrically mixed color with the adjacent pixels can be prevented.

Furthermore, according to the structure of the solid-state imaging device 1 of this embodiment, the $p^+$ region 19 is also provided on the rear-surface side of the N-type region 17 of the silicon layer 4, so that what is called a HAD (Hole Accumulated Diode) structure is formed on the rear-surface side as well, similarly to the front-surface side (the positive charge accumulating region 16).

Therefore, the occurrence of dark current generated in the vicinity of the interface of the silicon layer 4 on the rear-surface side can be restrained.

Further, the solid-state imaging device 1 of this embodiment is the CMOS image sensor (CMOS-type solid-state imaging device), so that the occurrence of smear which becomes a problem in the CCD solid-state imaging device does not occur.

Next, as an embodiment of the method for manufacturing the solid-state imaging device of the present invention, a method for manufacturing the solid-state imaging device having the back-illuminated type structure similar to the solid-state imaging device 1 of FIG. 2 is explained.

Figure 7:
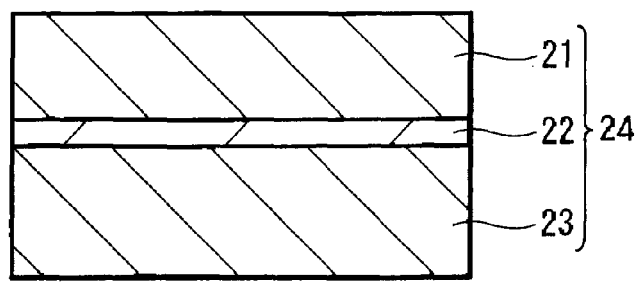
FIG. 7 is a vertically sectional view of an SOI substrate.

In this embodiment, as shown in the vertical section in FIG. 7, an SOI substrate 24 is used, in which on a silicon substrate 23 a silicon layer 21 is formed with a silicon oxide coating ($SiO_2$ coating) as an intermediate layer 22 in between.

With respect to the SOI substrate 24, the whole thickness thereof is 725 µm or less, for example, and the thickness of the silicon layer 21 is 10 µm or less (preferably 5 µm or less).

Figure 8A:
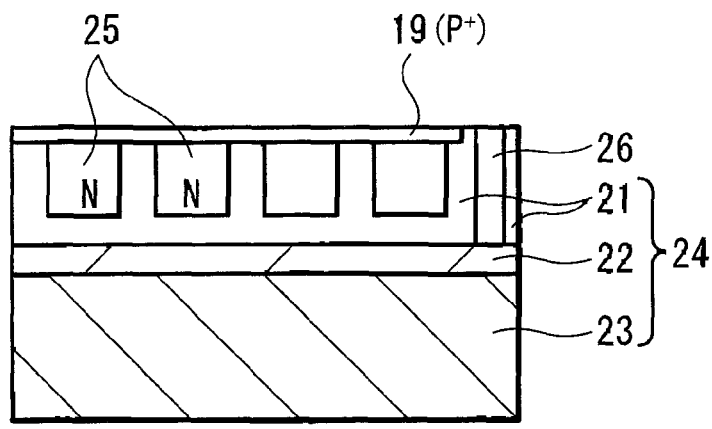
FIGS. 8A to 8C are manufacturing process views showing an embodiment of a method for manufacturing a solid-state imaging device according to the present invention.

First, as shown in FIG. 8A, an N-type region 25 which becomes a main portion (a portion of the rear-surface side) of the N-type region 17 constituting the photo diode, and a $P^+$ region 19 on the rear-surface side are respectively formed in the silicon layer 21 of the SOI substrate 24 by ion implantation. In addition, a matching mark 26 used for positioning a color filter and an on-chip lens is formed together.

Figure 8B:
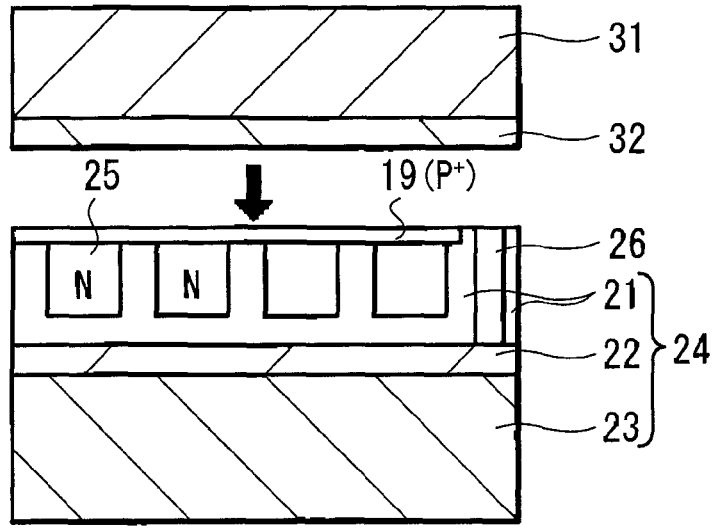

Next, as shown in FIG. 8B, an adhesive layer 32 is formed on a surface of a first supporting substrate 31, and the first supporting substrate 31 is adhered to the silicon layer 21 of the SOI substrate 24 with the adhesive layer 32 in between. Then, the heat treatment at, for example, a temperature of 1100 degree centigrade is performed for bonding. At this time, impurities in the N-type region 25 and in the P⁺ region 19 of the silicon layer 21 are activated.

Figure 8C:
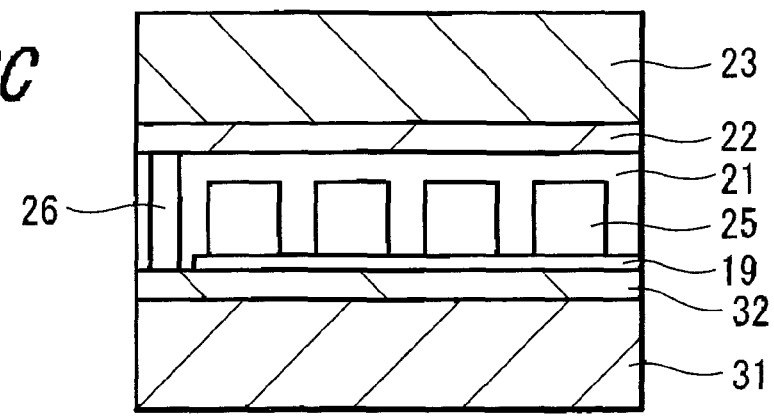

Next, as shown in FIG. 8C, a wafer is positioned upside down.

Figure 9A:
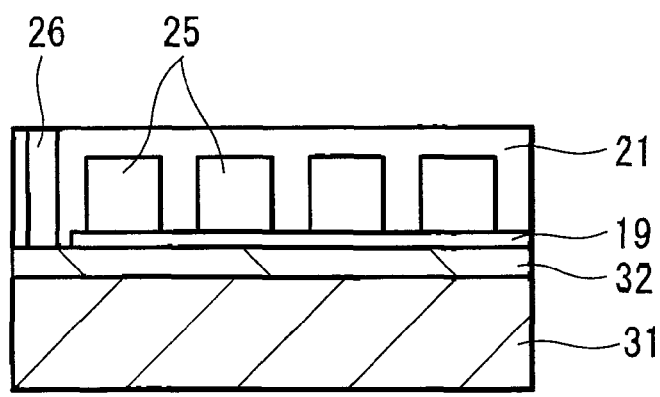
FIGS. 9A to 9C are manufacturing process views showing an embodiment of a method for manufacturing a solid-state imaging device according to the present invention.

Subsequently, the silicon substrate 23 and the intermediate layer 22 that are on the silicon layer 21 are sequentially removed using a back-grind method, a CMP (Chemical Mechanical Polishing) method, a wet-etching method or the like, for example. As a result, the silicon layer 21 is exposed as shown in FIG. 9A.

Figure 9B:
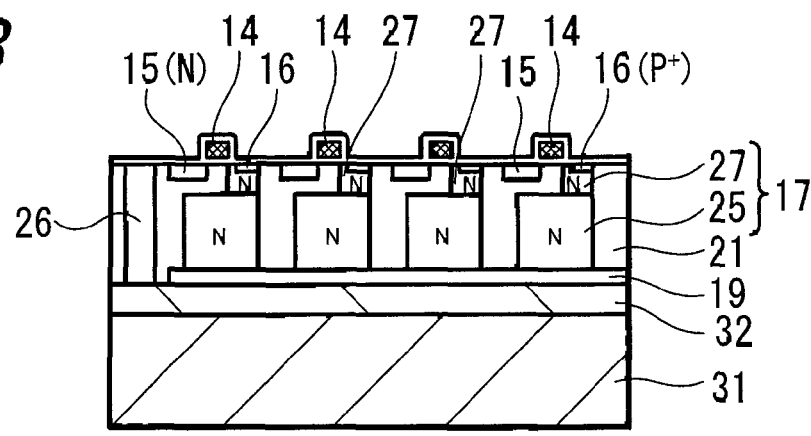

Next, a gate electrode 14 of a read-out transistor is formed on the silicon layer 21 with a thin insulative layer in between. Further, with respect to the silicon layer 21, ion implantation of an N-type impurity is performed from the front-surface side to form an N-type region 27 which becomes the front-surface side portion of the rest of the N-type region 17 constituting the photo diode, and a floating diffusion 15 composed of an N-type region. Moreover, with respect to the silicon layer 21, ion implantation of the P-type impurity is performed from the front-surface side to form on the surface of the N-type region 27 a positive charge accumulated region 16 of a P-type (p⁺) (refer to FIG. 9B).

Accordingly, the N-type region 17 of the photo sensor portion is formed of both the N-type region 25 which was formed from the rear-surface side and the N-type region 27 which was formed from the front-surface side.

Figure 9C:
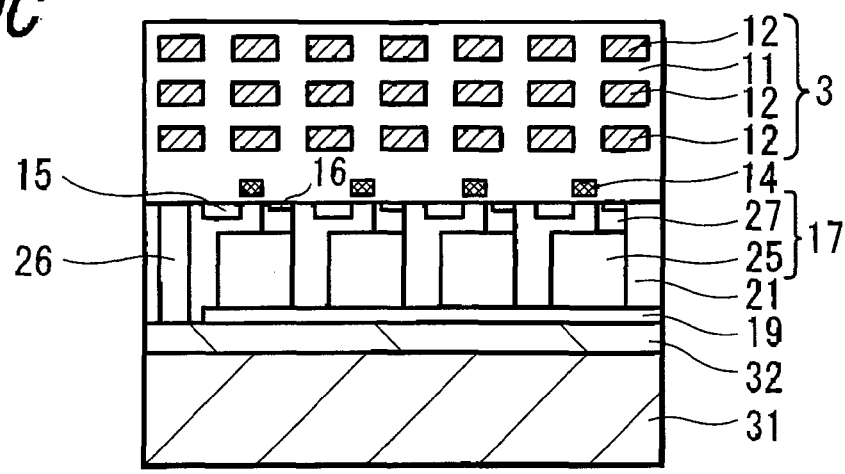

Subsequently, as shown in FIG. 9C, the wiring portion 3, in which a plurality of wiring layers 12 are formed, is formed on the silicon layer 21 with the insulative layer 11 in between.

Furthermore, a protective coating is formed on the upper surface of the wiring portion 3, though not shown in the drawing. This protective coating is provided to prevent the wiring portion 3 from absorbing moisture, so that the wiring layer 12 is not affected by the moisture. For example, a silicon nitride coating is formed as the protective film by a plasma CVD method.

Figure 10A:
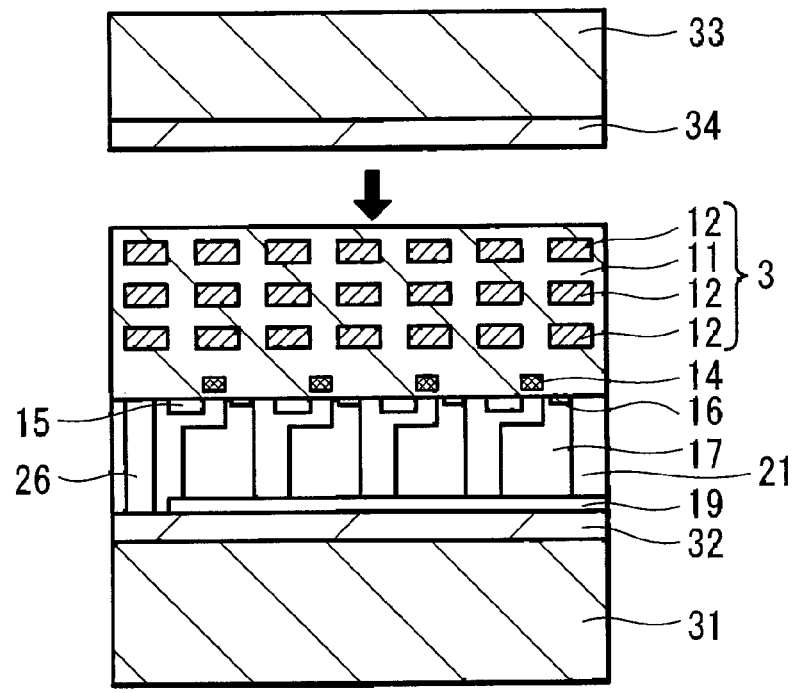
FIGS. 10A and 10B are manufacturing process views showing an embodiment of a method for manufacturing a solid-state imaging device according to the present invention.

Next, as shown in FIG. 10A, an adhesive layer 34 is formed on a surface of a second supporting substrate 33, and the second supporting substrate 33 is adhered to the wiring portion 3 with the adhesive layer 34 in between. Then, the heat treatment at a temperature of 400 degree centigrade or less is performed for bonding. Since the heat treatment at this time is performed after the wiring layer 12 was formed, the treatment is performed at a lower temperature of 400 degree centigrade or less so that the wiring layer 12 can be prevented from the influence. A SOG (Spin On Glass) and a metal layer capable of metal-bonding can be used as the adhesive layer 34 in this case.

Figure 10B:
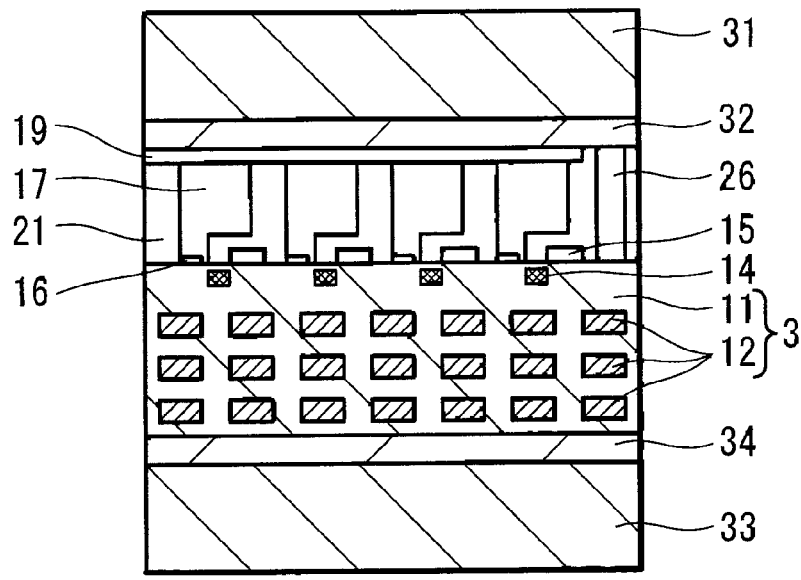

Next, as shown in FIG. 10B, a wafer is positioned again upside down.

Figure 11A:
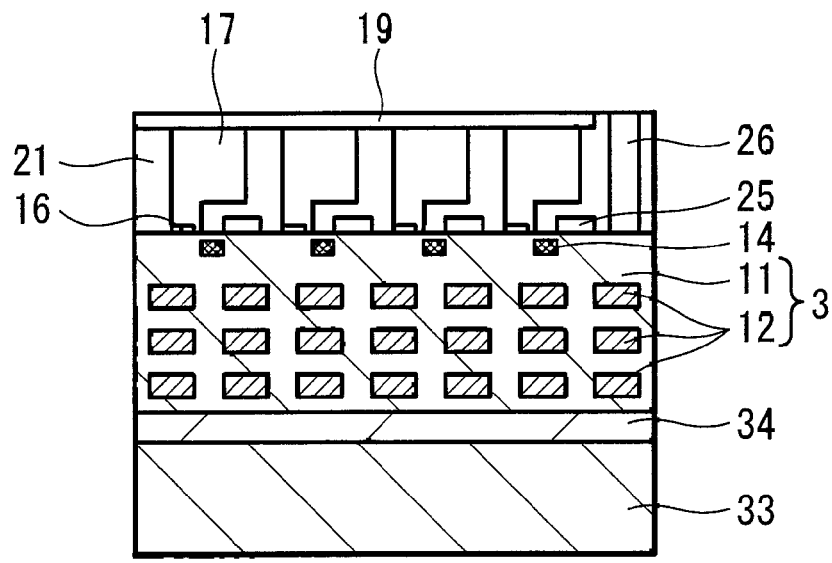
FIGS. 11A and 11B are manufacturing process views showing an embodiment of a method for manufacturing a solid-state imaging device according to the present invention.

Subsequently, the first supporting substrate 31 and the adhesive layer 32 that are on the silicon layer 21 are removed using a back-grind method, a CMP (Chemical Mechanical Polishing) method, a wet-etching method or the like, for example. As a result, the silicon layer 21 is exposed, as shown in FIG. 11A.

Figure 11B:
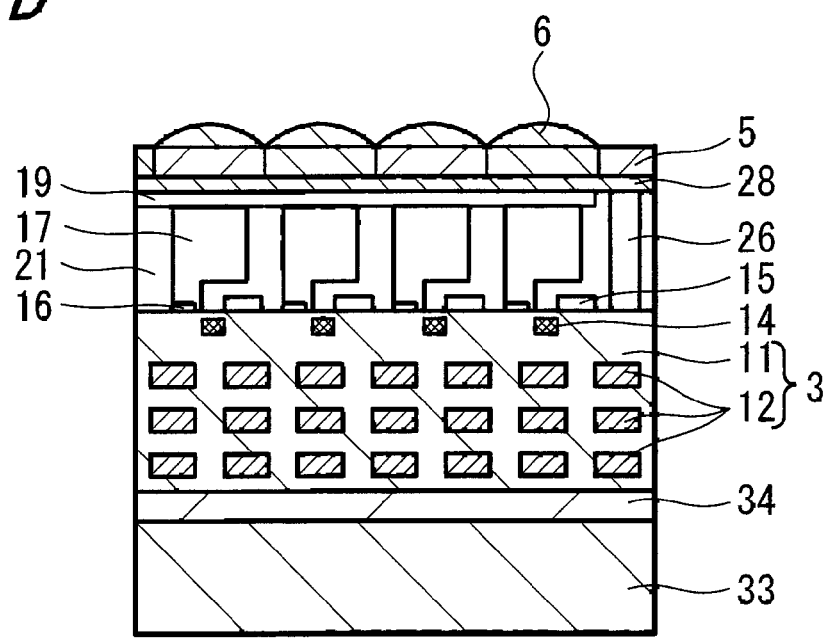

Next, as shown in FIG. 11B, an anti-reflective coating 28 is formed on the silicon layer 21, and a color filter 5 and an on-chip lens 6 are formed thereon sequentially. A pad electrode for connecting to the outside terminal or the like is also formed, though not shown in the drawing.

As heretofore described, the solid-state imaging device of the back-illuminated type structure can be manufactured.

In addition, in a CMOS image sensor such as the solid-state imaging device 1 shown in FIG. 2, a peripheral circuit portion which performs driving, control and others of the solid-state imaging device 1, are formed on the same semiconductor chip together with the solid-state imaging device 1 which constitutes an imaging portion.

Therefore, though not shown in the drawing, a semiconductor region of the transistor and others of the peripheral circuit portion are also formed when the semiconductor region of the photo sensor portion is formed.

According to the above-described manufacturing method of this embodiment, the solid-state imaging device having a similar structure to the solid-state imaging device 1 shown in FIG. 2, namely the solid-state imaging device in which the thickness of the silicon layer where the photo sensor portion was formed, is 10 μm or less (preferably 5 μm or less), can be manufactured.

Therefore, in accordance with the manufacturing method of this embodiment, a high sensitivity can be obtained in the visible light range, and mixed color and the shading caused by light incident on the adjacent pixels and electrically mixed color with the adjacent pixels can be restrained; the dynamic range can be improved; and the solid-state imaging device without the smear can be manufactured.

Figure 1:
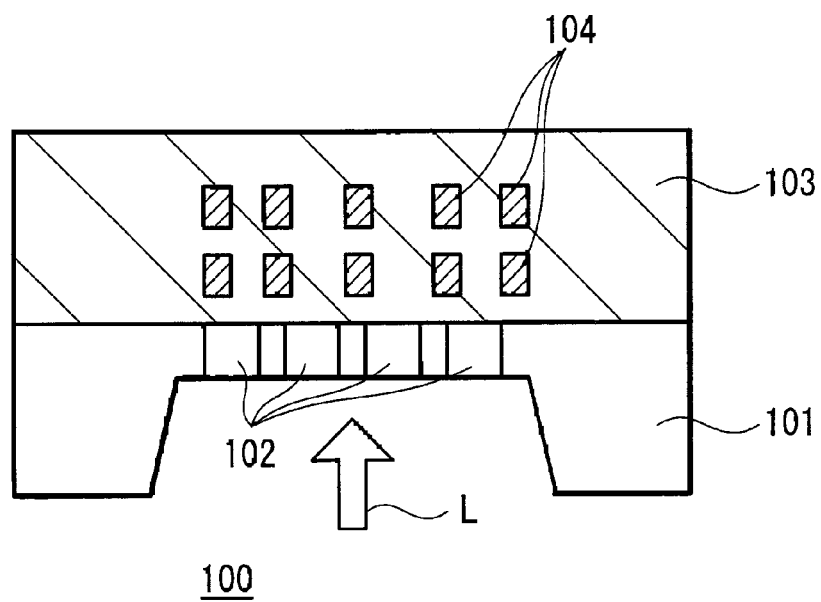
FIG. 1 is a schematic and vertically sectional view of a back-illuminated type CMOS image sensor.

In this embodiment, since the silicon layer 21 is formed on the SOI substrate 24 in advance, an interface thereof is comparatively stable and the dark current generated on the interface can be reduced compared with the structure shown in FIG. 1.

Further, since the thickness of the silicon layer 21 can be controlled favorably and the spectroscopic characteristic can be stabilized, the yield ratio of manufacturing can be improved.

Furthermore, with respect to the silicon layer 21, since the wiring portion 3 is formed on the front-surface side; the first supporting substrate 31 is bonded to the rear-surface side; and thereafter the first supporting substrate 31 is removed, the silicon layer 21 is not ground, so that a mechanical damage to the silicon layer 21 can be prevented.

Further, in this embodiment, since the SOI substrate 24 is used, it becomes possible to manufacture the solid-state imaging device with lower cost using an existing (commercially available) inexpensive SOI substrate 24, for example.

Particularly, in the manufacturing method of this embodiment, the crystallinity on the interface of the active layer of the silicon layer 21 can be improved by the heat treatment at a comparatively high temperature when the first supporting substrate 31 is bonded, so that the solid-state imaging device with low noise can be manufactured. Further, since the p⁺ region 19 on the rear-surface side is formed by ion implantation into the silicon layer 21 from the rear-surface side, the position of the p⁺ region 19 can be controlled easily in the vicinity of the interface of the rear-surface side of the silicon layer 21.

Next, as another embodiment of the method for manufacturing the solid-state imaging device of the present invention, another method for manufacturing a solid-state imaging device having the back-illuminated type structure similar to the solid-state imaging device 1 of FIG. 2 is explained.

In this embodiment, the SOI substrate 24 shown in the vertical section of FIG. 7 is also used.

In the SOI substrate 24, the whole thickness thereof is 725 μm and the thickness of an intermediate layer (SiO₂ coating) 22 is 10 μm or less for example, and the thickness of the silicon layer 21 is 10 μm or less (preferably 5 μm or less).

Figure 12A:
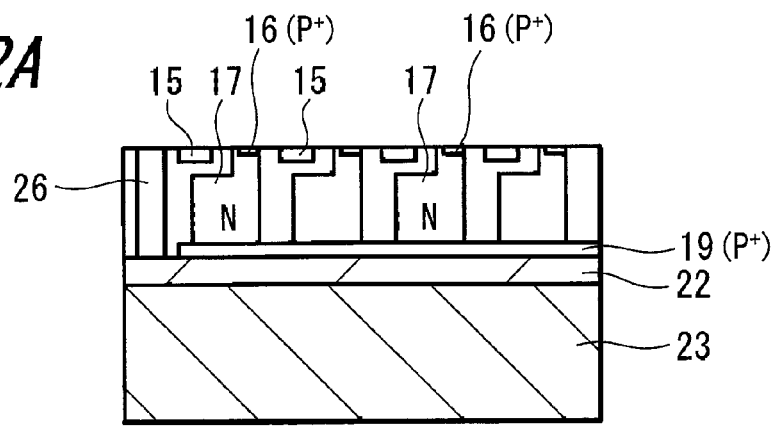
FIGS. 12A to 12C are manufacturing process views showing another embodiment of a method for manufacturing a solid-state imaging device according to the present invention.

First, as shown in FIG. 12A, the N-type region 17 constituting the photo diode, the p⁺ region 19 on the rear-surface side, the p⁺ region 16 on the front-surface side and the N-type region which forms the floating diffusion 15 are respectively formed on the silicon layer 21 of the SOI substrate 24 by ion implantation. In addition, the matching mark 26 is formed for positioning the color filter and the on-chip lens. Note that, the N-type region 17 has different patterns in the upper portion and in the lower portion, so that the ion implantation is performed twice, in which the lower portion is formed and then the upper portion is formed, for example.

At this time, when the thickness of the silicon layer 21 is 5 µm or less, the ion implantation can be performed using the photo resist (not shown in the drawing) as the mask; however, when the thickness of the silicon layer 21 is more than 5 µm, the ion implantation is required to be performed with a comparatively high energy using the hard mask such as an oxide coating.

Next, the gate electrode 14 of the read-out transistor is formed on the silicon layer 21 with a thin insulative coating in between.

Figure 12B:
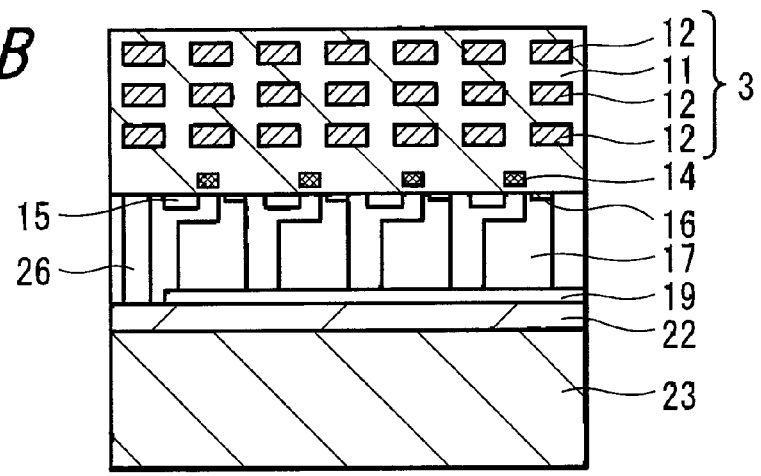

Subsequently, as shown in FIG. 12B, the wiring portion 3 is formed on the silicon layer 21, in which a plurality of wiring layers 12 are formed with the insulative layer 11 in between.

Further, a protective coating is formed on the upper surface of the wiring portion 3, though it is not shown in the drawing. This protective coating is to prevent the wiring layer 12 from being affected by the wiring portion 3 absorbing moisture. For example, the silicon nitride coating is formed by a plasma CVD method.

Figure 12C:
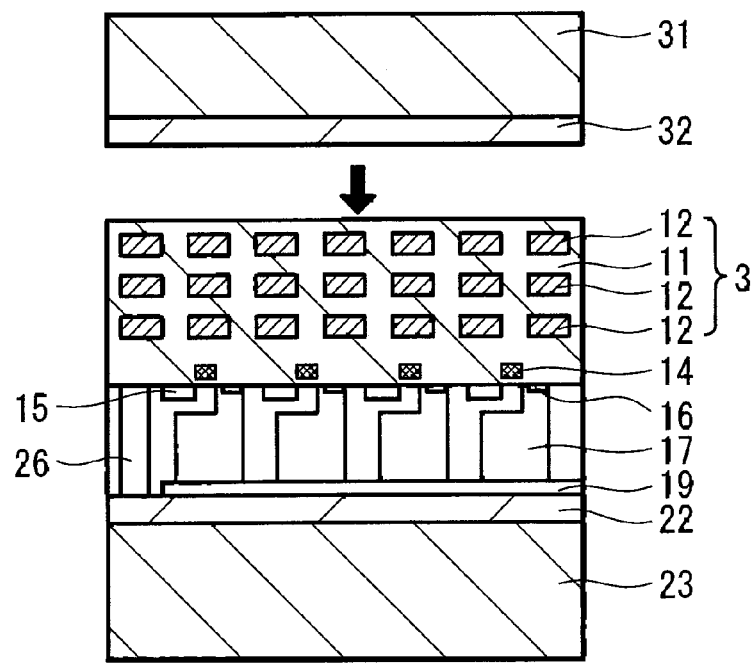

Then, as shown in FIG. 12C, an adhesive layer 32 is formed on a surface of the first supporting substrate 31, and the first supporting substrate 31 is adhered to the wiring portion 3 with this adhesive layer 32 in between. After that, the heat treatment at 400 degree centigrade or less is performed to bond the first supporting substrate 31 to the wiring portion 3. Since the heat treatment at this time is performed after the wiring layer 12 was formed, temperature thereof is set to lower to be 400 degree centigrade or less for preventing the wiring layer 12 from being affected. An SOG (Spin On Glass) and a metal layer capable of metal bonding can be used as the adhesive layer 32 in this case.

Figure 13A:
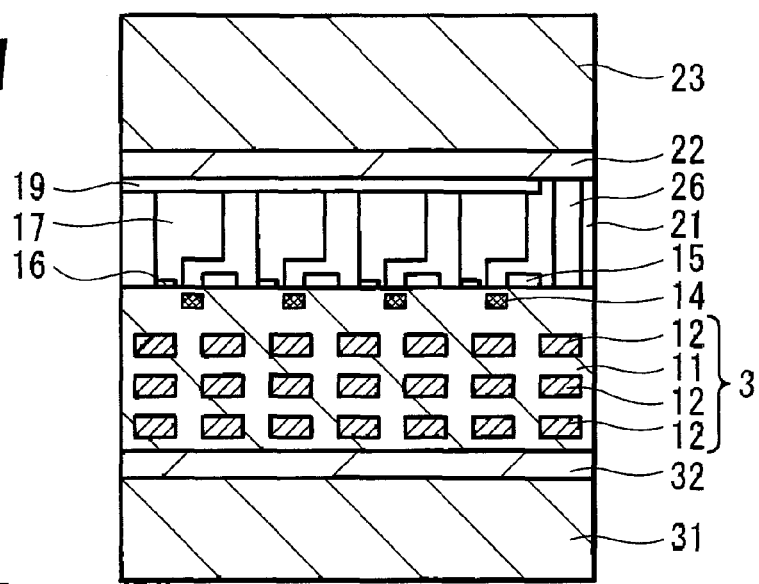
FIGS. 13A to 13C are manufacturing process views showing another embodiment of a method for manufacturing a solid-state imaging device according to the present invention.

Then, as shown in FIG. 13A, a wafer is positioned upside down.

Figure 13B:
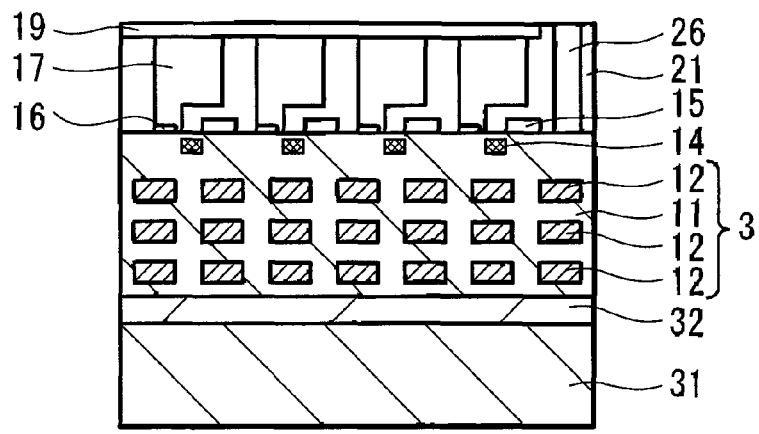

Subsequently, the rear-surface side is etched by a backgrinding method, a CMP (Chemical Mechanical Polish) method, a wet-etching method or the like, for example, and the silicon substrate 23 and the intermediate layer (SiO$_2$ coating) 22 of the SOI substrate 24 are removed. Accordingly, as shown in FIG. 13B, the silicon layer 21 is exposed.

Next, an oxide coating is formed by oxidizing the upper surface of the silicon layer, though not shown in the drawing.

Figure 13C:
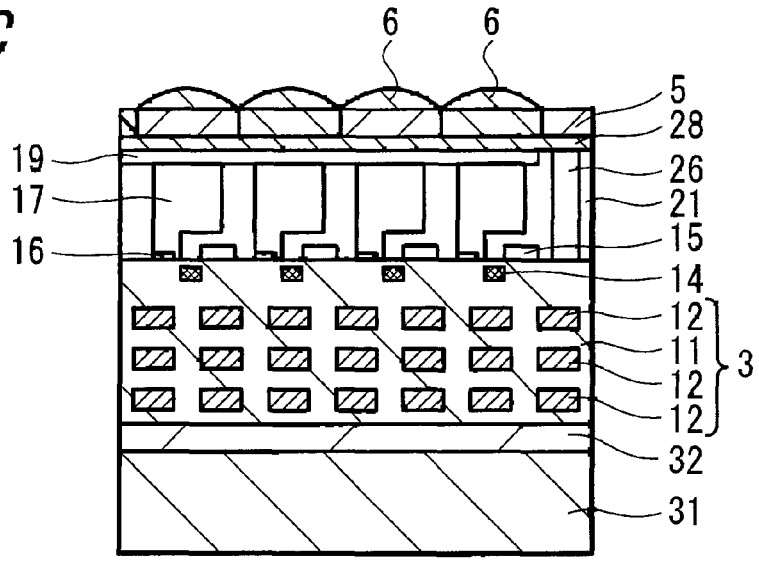

After that, as shown in FIG. 13C, an anti-reflective coating 28 is formed on the silicon layer 21, and a color filter 5 and an on-chip lens 6 are formed thereon sequentially. A pad electrode for connecting to the outside terminal is also formed, though not shown in the drawing.

Accordingly, the solid-state imaging device of the back-illuminated type structure can be manufactured.

In addition, also in this case, the semiconductor region of the transistor and others of the peripheral circuit portion is formed when the semiconductor region of the photo sensor portion is formed. Similarly, also the wiring of the peripheral circuit portion is formed as the wiring layer 12.

According to the above-described manufacturing method of this embodiment, the solid-state imaging device having the same structure as that of the solid-state imaging device 1 shown in FIG. 2, namely the solid-state imaging device in which the thickness of the silicon layer where the photo sensor portion is formed, is 10 µm or less (preferably 5 µm or less), can be manufactured.

Therefore, in accordance with the manufacturing method of this embodiment, a high sensitivity can be obtained in the visible light range; mixed color and the shading caused by the light incident on the adjacent pixels and the electrically mixed color with the adjacent pixels can be controlled; the dynamic range can be improved; and then, the solid-state imaging device without the occurrence of smear can be manufactured.

In the above embodiment, since the silicon layer 21 is formed on the SOI substrate 24 in advance, an interface of the silicon layer 21 is comparatively stable, so that the dark current generated on the interface can be reduced less than that of the structure shown in FIG. 1.

Further, since the thickness of the silicon layer 21 can be controlled favorably, the spectroscopic characteristic thereof can be stabilized, so that the yield ratio of manufacturing can be improved.

In addition, with respect to the silicon layer 21, since the wiring portion 3 is formed on the front-surface side and the silicon substrate 23 and the intermediate layer 22 on the rear-side surface are removed, the silicon layer 21 is not ground, so that a mechanical damage can be prevented from affecting the silicon layer 21.

Furthermore, in the above embodiments, since the SOI substrate 24 is used, it becomes possible to manufacture a solid-state imaging device with lower cost using the existing (commercially available) inexpensive SOI substrate 24, for example.

Particularly, in the manufacturing method of the above embodiment, since the heat treatment is performed at a comparatively low temperature of 400 degree centigrade or less, the influence of the heat treatment on the impurity regions of the source/drain and others of the transistor which is formed in a portion other than the photo resist of the silicon layer is made small. As a result, since the channel length of the transistor can be shortened more by applying the latest design rule, the miniaturization can be performed easily.

Note that, in the case where the thickness of the silicon layer 21 of the SOI substrate 24 has approximately 10% dispersion, the spectroscopic characteristic can not be influenced; however, dispersion with respect to the depth of the N-type region 17 and to the position of the P$^+$ region 19 on the rear-surface side may occur, even if the ion implantation is performed under the same condition.

If the P$^+$ region 19 on the rear-surface side is formed at the position deeper than the interface of the silicon layer 21 on the rear-surface side, the effectiveness that controls the dark current becomes insufficient, and the noise occurs, which is undesirable. On the other hand, if the P$^+$ region 19 on the rear-surface side is formed at the position shallower than the interface of the silicon layer 21 on the rear-surface side, the P$^+$ region 19 becomes an electrical barrier and the amount of electric-charge which can be read out decreases, so that the sensitivity deteriorates.

Against the dispersion of the thickness of the silicon layer 21, such measures are efficient, in which wafers with almost the same thickness (within the range in which the dispersion can be neglected) of the silicon layer 21 are selected and used, for example; and in which the condition (regarding the energy and others) of the ion implantation is controlled to be changed corresponding to the thickness of the silicone layer 21, for example.

Further, in the above embodiment, as shown in FIG. 12A, the N-type region 17 and P$^+$ region 19 on the rear-surface side are formed by performing the ion implantation from the front-surface side of the silicon layer 21; however, if the implanted ion can be activated at a comparatively low temperature, it is also possible that the portion on the rear-surface of the N-type region 17 and P+ region 19 are formed by performing the ion implantation from the rear-surface side, after the silicon substrate 23 removed (after the process of FIG. 13B). Specifically, similarly to the previous embodiment of the present invention, the ion implantation can be performed twice from the front-surface sided and from the rear-surface side.

Further, in each of the above-described embodiments, the N-type region 17 is formed as a region in which the photoelectric conversion of the photo sensor portion is performed, and P+ regions 16 and 19 are formed on the front-surface side and the rear-surface side of the N-type region 17, respectively; however, the present invention can be applied to the structure that has the inverse-conduction type respectively.

In addition, in each embodiment of the above-described manufacturing methods, the SOI substrate 24 in which the $SiO_2$ coating is employed as the intermediate layer 22 was used, and in the manufacturing methods of the present invention a layered substrate in which the silicon substrate, the intermediate layer and the silicon layer are laminated is used; however, it is also possible to use a layered substrate in which other materials, for example, porous-silicon and other easily removable materials are employed as the intermediate layer.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A method for manufacturing a solid-state imaging device comprising at least the steps of:
    forming photo sensor portions in a silicon layer over a substrate, a first conductivity type region being included in the photo sensor portions and a second conductivity type region being formed in the silicon layer implanted from a rear-surface of the solid-state imaging device by ion implantation, wherein an incident light enters from said rear-surface of the solid-state imaging device;
    bonding a second supporting substrate onto said wiring portion, the bonding of said second supporting substrate onto the wiring portion being performed utilizing a heat treatment of 400 degrees centigrade or less;
    removing a substrate bonded onto said silicon layer utilizing back-grind, chemical mechanical polishing, or wet etch to expose said silicon layer in response to performing the bonding of said second supporting substrate onto said wiring portion.

2. The method of claim 1, wherein the second conductivity type region is a hole accumulation layer on the rear-surface side in said silicon layer formed before said bonding said first supporting substrate, the hole accumulation layer restraining dark current generated in a vicinity of an interface of the silicon layer.

3. The method of claim 1, wherein said second supporting substrate is bonded on to said writing portion by means of an adhesive layer.

4. The method of claim 3, wherein said adhesive layer is a SOG layer or a metal layer.

5. The method of claim 1, wherein the substrate is 725 μm or less, and the thickness of the silicon layer is 10 μm or less.

6. The method of claim 5, wherein the silicon layer is 5 μm or less.

7. The method of claim 6, wherein the bonding comprises:
    performing a heat treatment such that impurities in the first conductivity type region and the second conductivity type region are activated.

8. The method of claim 1, wherein a matching mark for positioning a color filter and an on-chip lens is formed together in response to forming the first conductivity type region and the second conductivity type region.

9. The method of claim 7, wherein the substrate and an intermediate layer bound to the substrate are removed utilizing back-grind, chemical mechanical polishing or wet etch to expose the silicon layer in response to performing the heat treatment.

10. The method of claim 1, further comprising:
    forming a read-out transistor on the silicon layer out of a gate electrode an end of the first conductivity type region and a floating diffusion on the front-surface side.

11. The method of claim 1, further comprising:
    forming a protecting coating on an upper surface of the wiring portion preventing the wiring portion from absorbing moisture, the wiring portion including a plurality of wiring layers separated by an insulative layer, the wiring portion being formed on the rear-surface side.

12. The method of claim 1, further comprising:
    sequentially forming an anti-reflective coating on the silicon layer, a color filter on the anti-reflective coating, and an on-chip lens.

13. A method for manufacturing a solid-state imaging device comprising at least the steps of:
    forming photo sensor portions in a silicon layer over a substrate;
    bonding a first supporting substrate with an adhesive layer onto said silicon layer;
    forming a wiring portion above said silicon layer;
    bonding a second supporting substrate onto said wiring portion;
    removing said first supporting substrate in response to performing the bonding of the second supporting substrate onto the wiring portion; and
    sequentially forming an anti-reflective coating on the silicon layer, a color filter on the anti-reflective coating, and an on-chip lens.

14. The method of claim 3, wherein (a) the first conductivity type region is expanded by ion implantation of a front-side surface of the solid-state imaging device, the first conductivity type region further forming the photo sensor portions, and (b) a second conductivity type region is formed in the silicon layer implanted from a rear-surface of the solid-state imaging device by ion implantation.

15. The method of claim 14, further comprising:
    forming a floating diffusion composed of an N-type region, and a p-type region are in the silicon layer of the substrate by ion implantation from a front-surface side of the solid-state imaging device, the P-type region forming a positive charge accumulation region.

16. A method for manufacturing a solid-state imaging device comprising at least the steps of
    forming photo sensor portions in a silicon layer over a substrate, an N-type region being included in the photo sensor portions and a P+ type region being formed in the silicon layer implanted from a rear-surface of the solid-state imaging device by ion implantation;
    bonding a first supporting substrate onto said silicon layer;
    forming a wiring portion above said silicon layer;
    bonding a second supporting substrate onto said wiring portion, the bonding of the second supporting substrate onto the wiring portion being performed utilizing a heat treatment of 400 degrees centigrade or less;

removing the first supporting substrate utilizing backgrind, chemical mechanical polishing, or wet etch to expose the silicon layer in response to performing the bonding of the second supporting substrate onto the wiring portion; and forming an anti-reflective coating on the silicon layer, a color filter on the anti-reflective coating, and an on-chip lens, sequentially.

* * * * *